United States Patent
Pietruszynski et al.

(10) Patent No.: US 6,747,522 B2
(45) Date of Patent: Jun. 8, 2004

(54) DIGITALLY CONTROLLED CRYSTAL OSCILLATOR WITH INTEGRATED COARSE AND FINE CONTROL

(75) Inventors: David M. Pietruszynski, Austin, TX (US); Douglas R. Frey, Bethlehem, PA (US)

(73) Assignee: Silicon Laboratories, Inc., Austin, TX (US)

( * ) Notice: Subject to any disclaimer, the term of this patent is extended or adjusted under 35 U.S.C. 154(b) by 14 days.

(21) Appl. No.: 10/138,027

(22) Filed: May 3, 2002

(65) Prior Publication Data

US 2003/0206070 A1 Nov. 6, 2003

(51) Int. Cl.[7] ................................................. H01G 4/38
(52) U.S. Cl. ............................... 331/177 R; 331/36 C; 331/116 FE; 455/197.2
(58) Field of Search ....................... 331/177 R, 177 V, 331/179, 36 C, 116 FE; 334/55, 76, 78; 455/197.2

(56) References Cited

U.S. PATENT DOCUMENTS

| | | | | |
|---|---|---|---|---|
| 5,084,685 A | * | 1/1992 | Moller et al. | 331/1 A |
| 5,117,206 A | * | 5/1992 | Imamura | 331/158 |
| 5,764,112 A | * | 6/1998 | Bal et al. | 331/116 FE |
| 6,181,218 B1 | * | 1/2001 | Clark et al. | 331/177 R |
| 6,329,941 B1 | | 12/2001 | Farooqi | 341/145 |
| 6,473,021 B1 | | 10/2002 | Somayajula et al. | 341/172 |
| 6,563,390 B1 | * | 5/2003 | Kizziar | 331/116 R |

OTHER PUBLICATIONS

Takahiro Miki; et al., "An 80 MHz 8b CMOS D/A Converter", 1986 IEEE International Solid–State Circuits Conference Digest of Technical Papers, pp 132–133 (Feb. 1986).
C–H Lin, et al.; "A 10b 250MSample/s CMOS DAC in 1 mm2", 1998 IEEE International Solid–State Circuits Conference, pp. 14.1–1 –14.1–11 (Feb. 1998).
Georgantas, et al., "Low Power RF to Baseband Interface for Multi–Mode Portable Phones", European Low Power Initiative for Electronic System Design, EP 25702 I–MODE (Intracom, Institute for Communication and Computer Systems–National Technical University of Athens, 1999).

* cited by examiner

Primary Examiner—Minh Nguyen
(74) Attorney, Agent, or Firm—Davis & Associates; William D. Davis

(57) ABSTRACT

A method of tuning a DCXO includes the step of providing a coarse tuning array and a fine tuning array of capacitors fabricated on the same integrated circuit die. The coarse array is adjusted until the difference between a desired frequency and the output frequency corresponds to a change in capacitance no greater than half the range of the fine tuning array. In one embodiment, the fine tuning array is adjusted to mid-range before adjusting the coarse tuning array. A DCXO apparatus includes at least one integrated circuit segmented switched capacitor network providing a capacitance that is a nonmonotonic function of a composite input code. The segmented switched capacitor network includes parallel coupled binary weighted and thermometer coded switched capacitor networks for coarse and fine tuning, respectively.

23 Claims, 7 Drawing Sheets

DIGITALLY CONTROLLED CRYSTAL OSCILLATOR WITH INTEGRATED COARSE AND FINE CONTROL

FIELD OF THE INVENTION

This invention relates to the field of crystal oscillators. In particular, this invention is drawn to precise tuning control for crystal oscillators.

BACKGROUND OF THE INVENTION

Many communication systems require precise timing to permit synchronization of a receiver clock signal with a transmitter clock signal. Sophisticated communication algorithms require precise synchronization between the near and far end terminals for maximum data throughput on a communication channel.

The frequency of a crystal controlled oscillator tends to remain constant with a high degree of accuracy. However, even if substantially identical crystals with the same vibrational characteristics are used at the transmitter and receiver, temperature variations between the sites results in sufficient frequency mismatch between both ends of the communication channel to render the data unrecoverable. Further, process variation in the manufacture of the crystals typically results in mismatch on the same order of magnitude as that introduced by the temperature variations.

A frequency tracking system can be used to ensure synchronization between the ends of a communications channel. Voltage controlled crystal oscillators (VCXOs) are often used as components in a frequency tracking system. A common design incorporates varactor (voltage controlled capacitor based on a reverse biased p-n junction) tuning. As the voltage applied to the varactor is varied, the oscillator frequency changes. The varactor typically enables frequency changes of up to 100 ppm.

Although the varactor ideally allows for continuously variable capacitance, practical applications use a digital-to-analog converter (DAC) to provide the varactor voltage in response to a digital input code. The DAC output and thus the voltage across the varactor is quantized in discrete steps. The number and size of the steps are determined by the total dynamic range of the DAC and the resolution required.

One disadvantage of this architecture is that the varactor size required for sufficient tuning range effectively ensures that the varactor must be an off-chip component. The required use of off-chip controllable variable components is undesirable for cost or space concerns.

SUMMARY OF THE INVENTION

In view of limitations of known systems and methods, methods and apparatus for tuning a digitally controlled crystal oscillator to a desired frequency are provided.

One method includes the step of providing a DCXO having a coarse tuning array and a fine tuning array of capacitors fabricated on a same integrated circuit die. The coarse array is adjusted until the difference between the desired frequency and the output frequency corresponds to a change in capacitance no greater than half the range of the fine tuning array. In one embodiment, the coarse array is varied until the required change in capacitance is less than the capacitance associated with the least significant bit of the coarse tuning array. The fine tuning array is adjusted until the output frequency substantially matches the desired frequency. In one embodiment, the fine tuning array is adjusted to mid-range before adjusting the coarse tuning array.

A DCXO apparatus includes a coarse tuning array of capacitors providing a first range of tuning capacitance and a fine tuning array of capacitors providing a second range of tuning capacitance. The coarse and fine tuning arrays are coupled in parallel to form a first segmented capacitor network. The coarse and fine tuning arrays are formed on a same integrated circuit die. In one embodiment, the coarse tuning array is a binary weighted switched capacitor network and the fine tuning array is a thermometer coded switched capacitor network.

A DCXO apparatus includes at least one segmented switched capacitor network providing a capacitance that is a nonmonotonic function Z of a composite input code. A processor is coupled to provide the composite input code. The DCXO output frequency varies in response to the composite input code. In one embodiment, the segmented switched capacitor network includes an n-bit binary weighted coarse tuning array of capacitors and an m-bit thermometer coded fine tuning array of capacitors. In one embodiment, the thermometer coded array comprises unit capacitances $C_T$ of substantially the same value. The least significant bit of the binary weighted array has an associated capacitance $C_B$. In one embodiment $2^m C_T < C_B$. In an alternative embodiment, $2^m C_T \geq C_B$.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
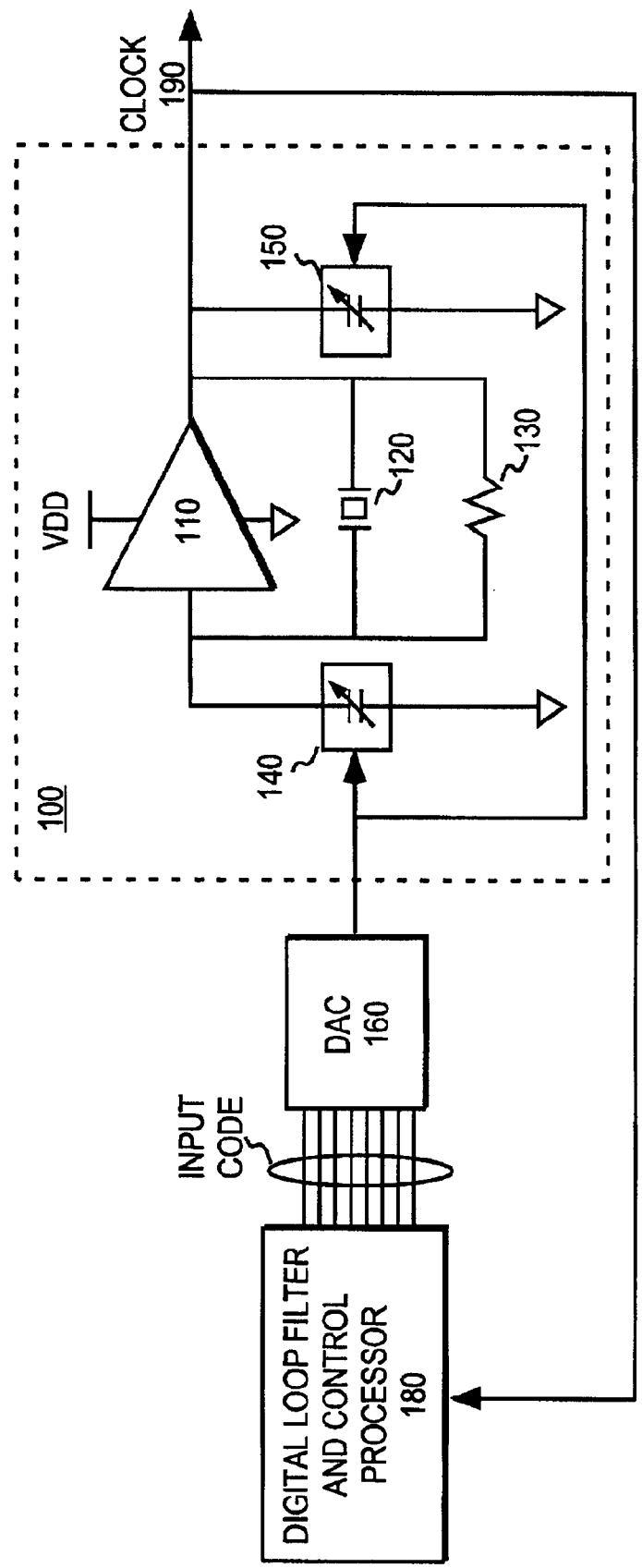
FIG. 1 illustrates a prior art VCXO architecture.

FIG. 1 illustrates a typical design for a VCXO 100 based on a Pierce oscillator circuit design. In one embodiment, each capacitive element 140 and 150 is a voltage controlled capacitor or varactor. In an alternative embodiment, one of the capacitive elements 140 and 150 is fixed rather than variable. The frequency of oscillation of the VCXO is related to the resonant frequency of crystal 120 located in the feedback path of amplifier 110 with some dependency on the values of varactors 140 and 150.

Digital control of the VCXO is achieved through the use of a digital-to-analog converter (DAC 160). Digital loop filter and control processor 180 provides a digital code to DAC 160 in response to an error signal determined from the VCXO output (clock 190). Although varactor 140 is an analog device, DAC 160 is only capable of providing a finite number of analog voltage values. VCXO 100 is effectively a digitally controlled crystal oscillator (DCXO) and is controllable only within the resolution limits of DAC 160 despite the use of an otherwise continuously variable tuning element, varactor 140.

The DAC provides an analog voltage signal to varactors 140 and 150 that corresponds to the DAC digital input codes. Varactors, however, are typically located off-chip (i.e., not on the same integrated circuit) due to size. Instead of a varactor, networks of switched capacitors may be used to achieve the necessary capacitances for the oscillator. The use of such switched capacitor networks eliminates the need for a DAC to select capacitance.

Figure 2:
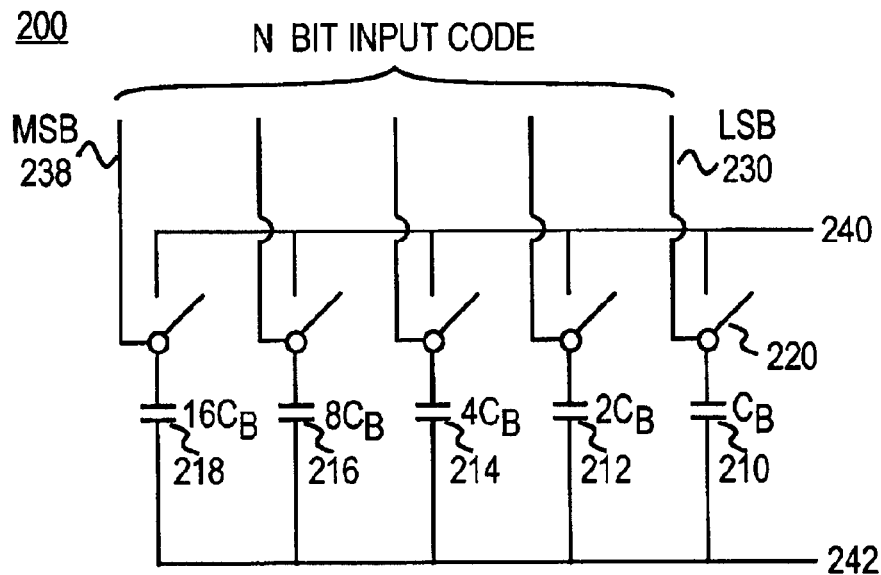
FIG. 2 illustrates a binary weighted switched capacitor network.

FIG. 2 illustrates one embodiment of an n-bit binary weighted array of selectable tuning capacitors 200. Each capacitor, e.g. 210, has an associated switch, e.g. 220. The switches enable selectively placing capacitors 210–218 in parallel with each other across nodes 240 and 242.

As a result of the binary weighting of capacitor values, no decode circuitry is required for the input signals 230–238 that control the switches. The input signals, e.g. 230 also serve as switch controls for their associated switch, e.g. 220. The capacitor 210 associated with the least significant bit 230 has a value of $C_B$. The next significant bit associated with capacitor 212 has a value of $2C_B$. Each next significant input signal bit is associated with a capacitor having a value twice as large as the previous input signal bit. Thus for an n-bit array, the capacitor associated with the $i^{th}$ input has a value $2^i C_B$ where i={0, . . . n−1} where $C_B$ is the capacitor value associated with the input signal of the least significant bit.

The binary tuning array can be used to converge very quickly on the appropriate capacitance value. The output capacitance value is a monotonic function of the input code. Only n capacitors, switches, and switch control lines are required for an n-bit input code in order to realize $2^n$ distinct values. Moreover, the input signal lines can serve as the switch control lines given that no decoding circuitry is required.

Although such an array may be fabricated on the same integrated circuit as the amplifier, the binary tuning array produces code dependent glitches which are proportional to the size of the capacitor(s) switched in or out. A transition from 10000 to 01111 reflects a difference of only one bit and a minimal change ($C_B$) in net capacitance, however, the capacitors being switched into and out of the circuit to achieve this net difference include a capacitor value of $2^5 C_B$. Attempting to make minor changes to the oscillator output frequency through small input code changes can introduce significant glitches into the circuitry which results in undesirable frequency variation of the oscillator output.

Figure 3:
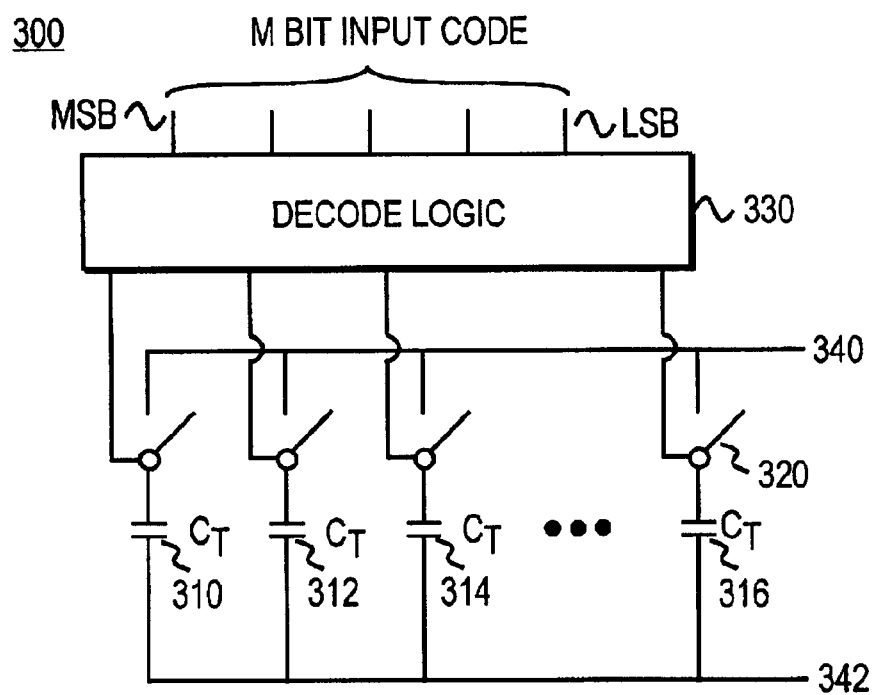
FIG. 3 illustrates a thermometer coded switched capacitor network.

An alternative switched capacitor network utilizes a thermometer coded (i.e., fully coded) approach. FIG. 3 illustrates one embodiment of an m-bit thermometer coded switched capacitor network 300.

Each capacitor, e.g. 316, has an associated switch, e.g. 320, to enable selectively placing capacitors 310–316 in parallel with each other. Although the capacitors, e.g. 316, each have a selectable switch 320, once a capacitor is selected by increasing (or decreasing) input code, further increases (or decreases) do not switch the capacitor 316 out (or in) again. A thermometer coded switched capacitor network requires decode logic 330. The output capacitance between nodes 340 and 342 is inherently a monotonic function of the input code even if the values of the switched capacitors are not identical.

In the illustrated embodiment, each switch is associated with the same unit capacitance $C_T$ such that the output capacitance is linear with respect to the input code. The switched capacitor network may be made nonlinear by using different capacitance values for each switch.

The thermometer coded switched capacitor network does not experience input code dependent glitches. Regardless of the number of input signals that transition to effect a net change of one bit, only a single unit capacitance (e.g., $C_T$) is switched in or out. Thus when transitioning between any two consecutive values only the glitch associated with the switching of a single capacitor is communicated.

Although a thermometer coded switched capacitor network can be fabricated on an integrated circuit die, one disadvantage of the thermometer coded switched capacitor network is that $2^m$ capacitors and switches as well as the decode logic and a significant number of switch control lines are required to realize $2^m$ possible distinct capacitance values for an m-bit input code. Thus the thermometer coded switched capacitor network may consume considerably more die area to achieve the same dynamic range as that achieved by the binary weighted switched capacitor network.

A segmented switched capacitor network is used to achieve both coarse and fine tuning of the DCXO. The segmented network includes a binary weighted switched capacitor network portion for coarse tuning and a thermometer coded switched capacitor network portion for fine tuning. The binary weighted switched capacitor network and the thermometer coded switched capacitor network are coupled so that their respective contributing output capacitances are in parallel.

Figure 4:
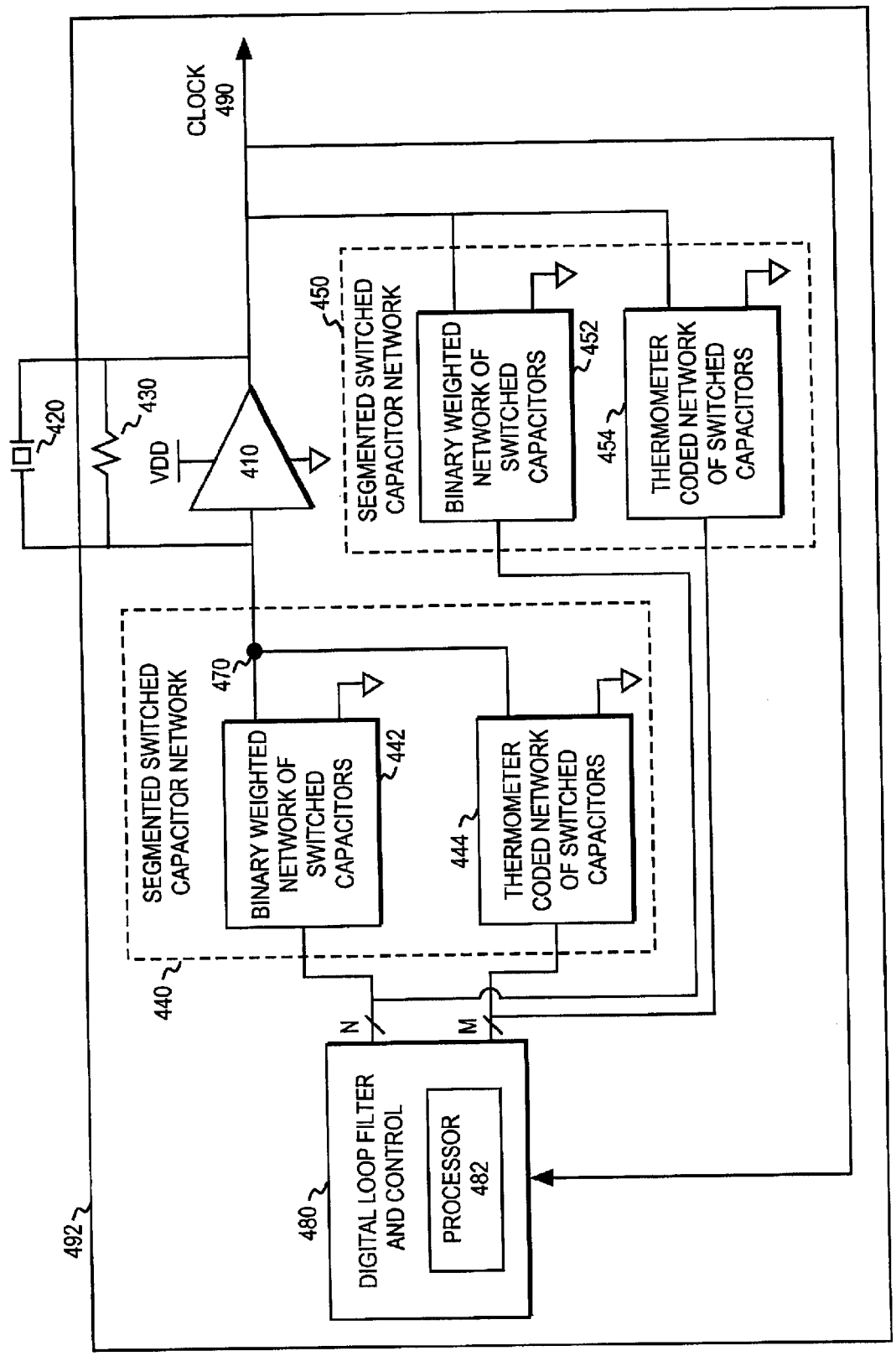
FIG. 4 illustrates a DCXO with a segmented switched capacitor network.

FIG. 4 illustrates one embodiment of a DCXO using segmented switched networks of tuning capacitors for each capacitive element of a Pierce oscillator. In an alternative embodiment, one capacitive element (e.g., 440) is a segmented switched network and the other (e.g., 450) has a fixed capacitance value. The amplifier 410 and the segmented switched networks of tuning capacitors 440 and 450 reside on the same integrated circuit die 492. Depending upon implementation, resistor 430 may reside off-chip or on the same integrated circuit die as the segmented switched network of tuning capacitors. Only crystal 420 needs to reside off-chip.

In various embodiments, the digital loop filter and control 480 including processor 482 may reside on the same integrated circuit die 492 or on a different integrated circuit die residing in an integrated circuit package distinct from the package containing 492 depending upon implementation. The clock output 490 of the DCXO is fed back to the digital loop filter and control. The digital loop filter and control adjusts the input codes to the segmented switched networks in order to reduce an error signal derived at least in part from the clock output signal. In one embodiment, the error signal is derived from the clock output signal and phase/amplitude characteristics of the signal captured from the communication channel.

Each segmented switched network of tuning capacitors 440 (450) includes the n-bit binary weighted network of switched capacitors 442 (452) and the m-bit thermometer coded network of switched capacitors 444 (454). The binary weighted network provides coarse tuning capability. The thermometer coded network provides fine tuning capability.

The binary weighted network may be referred to as the coarse tuning array. Similarly, the thermometer coded network may be referred to as the fine tuning array. The outputs of the thermometer coded network and the binary weighted network are coupled together to place the capacitance provided by each in parallel.

The input code may be viewed as a composite n+m bit input code wherein the first n bits control the binary weighted array and the next m bits control the thermometer coded array of tuning capacitors. The composite input code is expressed as θ which is formed by concatenating or appending the m bit input code to the n bit input code. The segmented network can be viewed as a function, Z, that maps θ into capacitance values.

In one embodiment, the mapping between output capacitances and segmented network input codes is monotonic. This implies that if the fine tuning array comprises j switchable capacitors of the same unit capacitance, $C_T$, then $jC_T<C_B$. (For an m bit thermometer coded array, $j=2^m$ such that $2^m C_T<C_B$.)

If $2^m C_T<C_B$, then there is no overlap of the binary and thermometer coded arrays. This means that there are capacitance values between adjacent discrete capacitor values provided by the binary weighted array that cannot be achieved or are not within the range of the fine tuning array. Such an arrangement may be acceptable, for example, in a broadband application where the binary weighted capacitor array is used to select a given communication channel from a plurality of channels where the distance between channels is greater than the bandwidth allocated to each channel. In such a case, the fine tuning array need not have the capability to provide a wide enough range of capacitances to tune the entire range between channels. The fine tuning array need only provide a sufficient range of capacitance values to tune a relatively narrow range of frequencies associated with the selected channel.

If Z is a map of capacitance values over the domain D of θ values, then the range of Z may be defined as follows:

Range(Z)=Z(D)={Z(θ):θ∈D}

Let D1 and D2 denote subsets of the domain D each having an associated range, R1 and R2, respectively. Then monotonicity implies that there is no overlap between R1 and R2 unless there is an overlap of D1 and D2 (i.e., D1∩D2=∅→R1∩R2=∅).

In an alternative embodiment, however, the range of the fine tuning array is designed to meet or exceed $C_B$. (i.e., $2^{mC}{}_T \geq C_B$). This implies that there are multiple distinct domains of composite input codes for which the corresponding ranges of capacitance values overlap. In this embodiment, the effective capacitance of the segmented switched capacitor network is no longer monotonic with respect to the input code. The segmented switched capacitor network may be referred to as having overlapping code. Each portion of the segmented switched network actually provides a capacitance that is a monotonic function of its respective portion of the input code. The effective capacitance of the segmented switched capacitor network, however, is nonmonotonic with respect to the composite input code.

The use of an overlapping code architecture permits the fine tuning array to be used to handle wider variations in the DCXO output frequency before resorting to the coarse tuning array.

Figure 5:
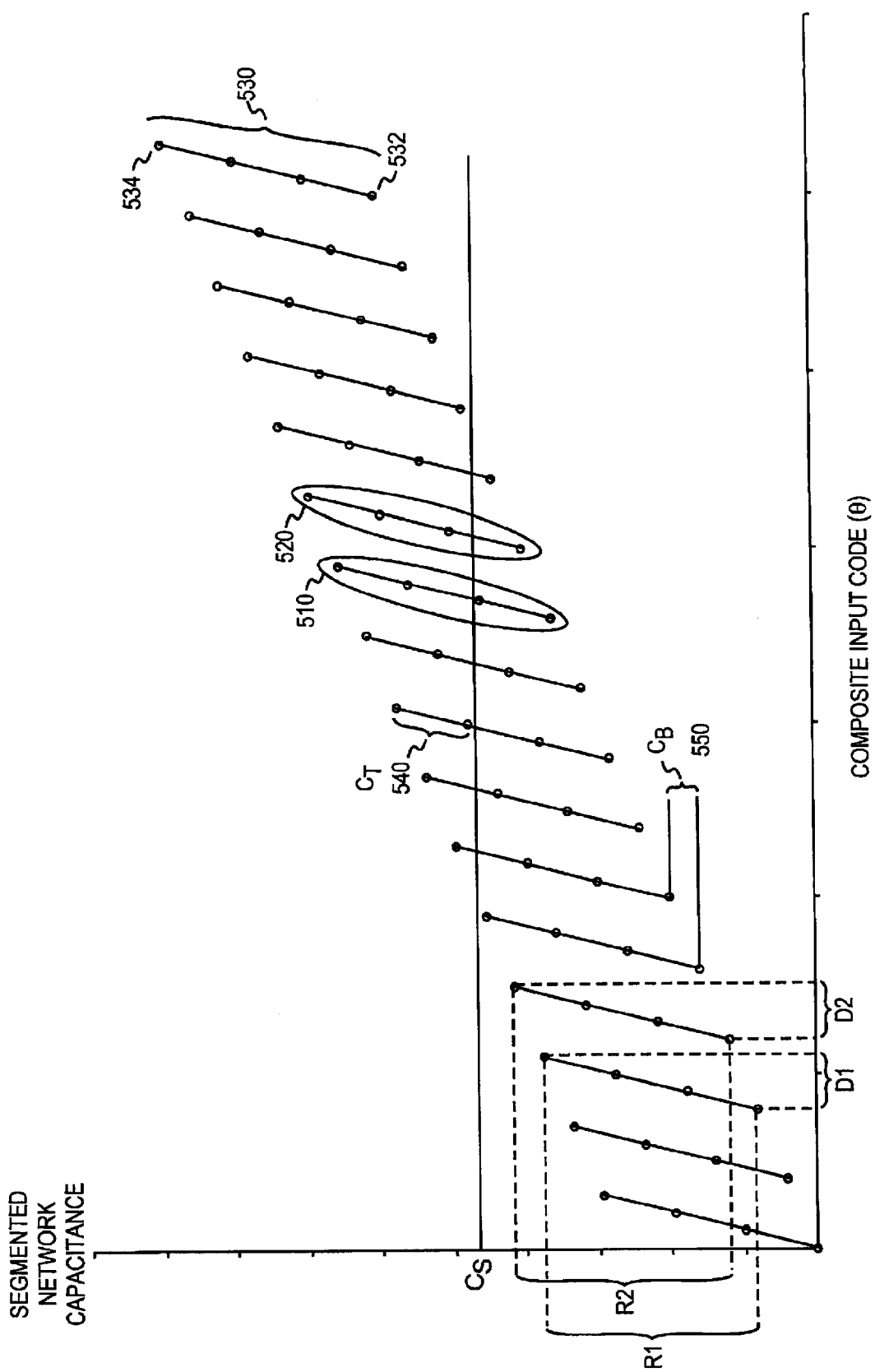
FIG. 5 illustrates the segmented network capacitance as a function of the composite input codes.

FIG. 5 illustrates one embodiment of the segmented switch capacitor network capacitance as a function of the composite input code. The capacitance values are described by a family of characteristic curves (510, 520). The number of bits (n) of the binary weighted network portion determines the number of such curves ($2^n$). The difference between minimum capacitance values between adjacent characteristic curves is determined by $C_B$ 550. In the illustrated embodiment, a 4 bit binary weighted switched capacitor network provides 16 selectable curves 510.

The thermometer coded network portion determines the number of distinct values 532–534 that can be obtained along a given characteristic curve 530. For a linear thermometer coded network, the difference between consecutively coded values along the same characteristic curve is determined by $C_T$ 540. In the illustrated embodiment m=2 such that the thermometer coded network can select any of four values 532–534 at intervals of $C_T$ for a given binary weighted network input code. In alternative embodiments, the thermometer coded network may be nonlinear (e.g., curvilinear) such that the distance between values 523–534 is not equidistant or the slope of the characteristic curve 530 is not substantially constant.

The capacitance of the segmented switched network is a nonmonotonic function of the composite input code. There exists distinct input code domains D1 (e.g., 560) and D2 (e.g., 570) with corresponding ranges R1 (e.g., 580) and R2 (e.g., 590) such that R1∩R2≠∅ even though D1∩D2=∅. Thus the segmented switched capacitor network has overlapping code. The extent of the overlapping (or overcoding) depends upon the relative values of n and m and $C_B$ and $C_T$.

The coarse array may be used to quickly converge to a capacitance value that accounts for process and initial temperature differences between the transmit and receive systems. One advantage of overcoding is that subsequent temperature fluctuations may be handled predominately by the thermometer coded fine tuning array without resorting to the glitch prone binary weighted coarse array.

Figure 6:
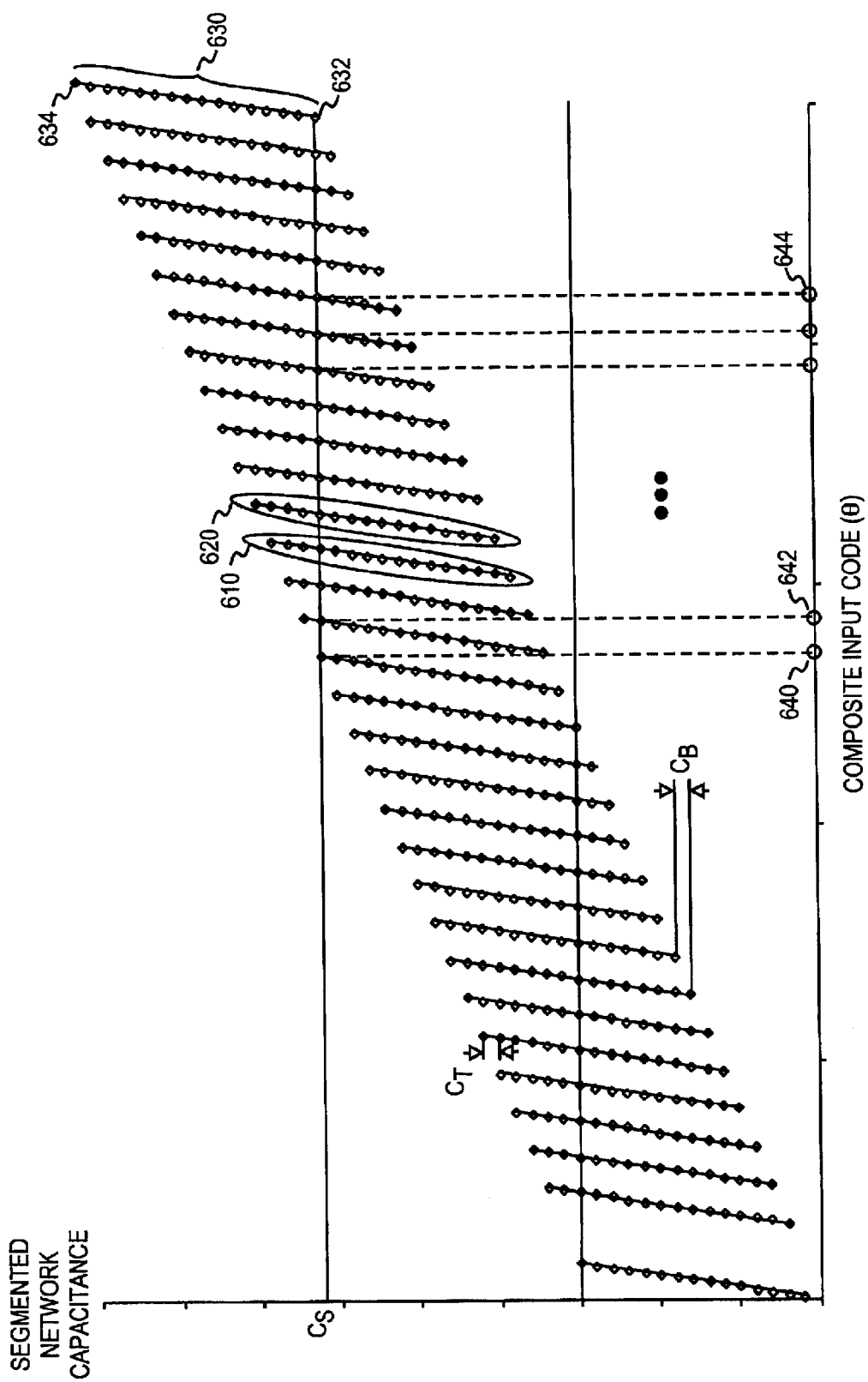
FIG. 6 illustrates another embodiment of the segmented network capacitance as a function of the composite input codes.

FIG. 6 illustrates another embodiment of segmented network capacitance as a function of the composite input code. The capacitance values are described by a family of characteristic curves (610, 620). The number of bits (n) of the binary weighted network determines the number of such curves ($2^n$). The difference between minimum capacitance values between adjacent characteristic curves is determined by $C_B$. In the illustrated embodiment, a 5 bit binary weighted switched capacitor network provides 32 selectable curves 610.

The thermometer coded network determines the number of distinct values 632–634 that can be obtained along a given characteristic curve 630. For a linear thermometer coded network, the difference between consecutively coded values along the same characteristic curve is determined by $C_T$. In the illustrated embodiment m=4 such that the thermometer coded network can select any of sixteen values 632–634 at intervals of $C_T$ for a given binary weighted network input code.

In this particular example, $C_T$ and $C_B$ are simple multiples or fractions of each other such that a number of distinct composite input codes, 642–644 can each achieve substantially the same capacitance Cs. In particular, there exists distinct input codes $θ_1$, $θ_2$ such that $Z(θ_1)=Z(θ_2)$. The frequency of repetition (i.e., distance between input codes before the same capacitance $C_s$ is repeated) is a function of n, m, $C_T$, and $C_B$. In one embodiment, n=10, m=8, and $C_T=C_B$.

Figure 7:
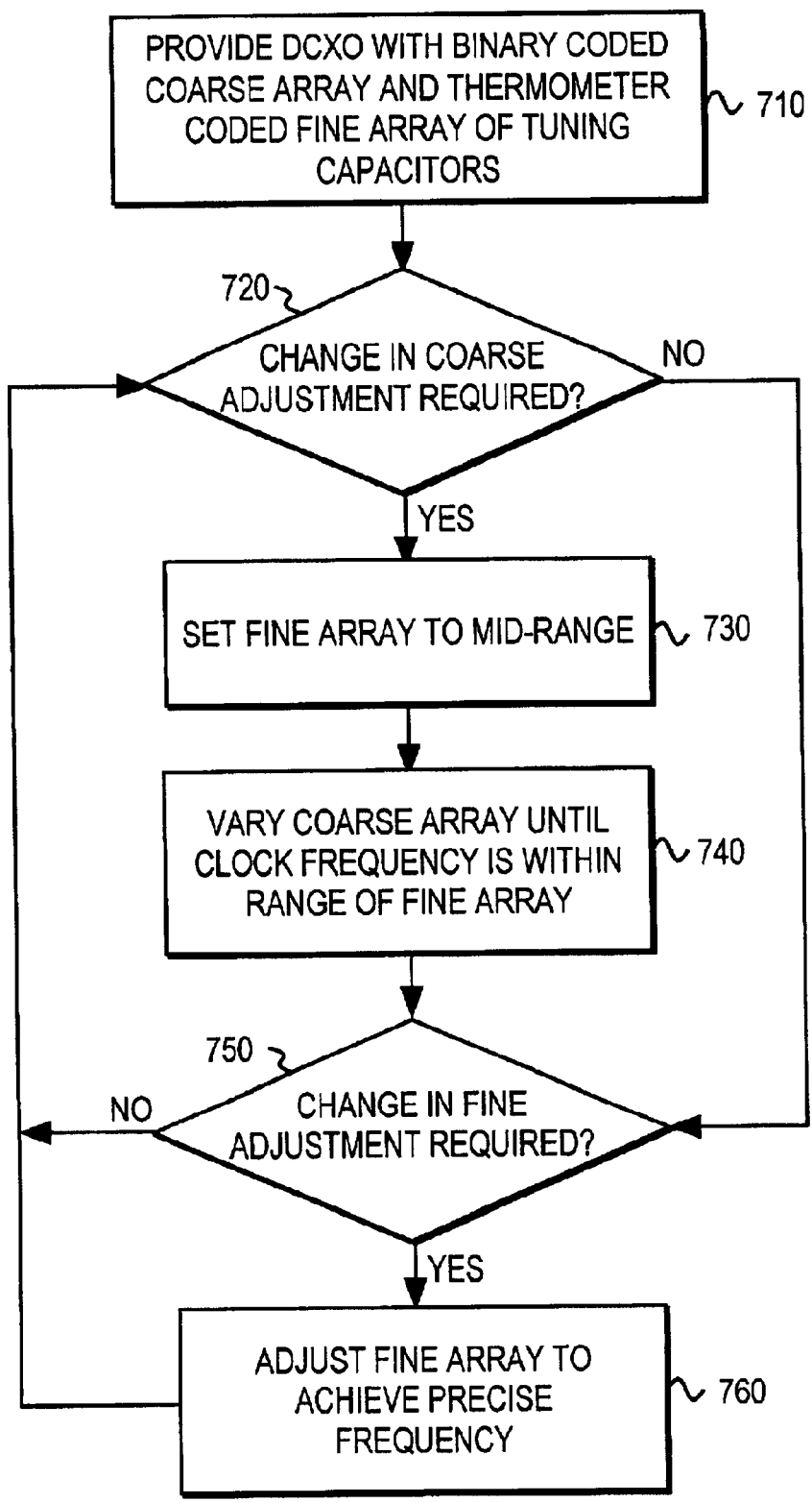
FIG. 7 illustrates a method of tuning a DCXO with a binary weighted coarse array and a thermometer coded fine array of tuning capacitors.

FIG. 7 illustrates a method of tuning a DCXO having a segmented network of switched tuning capacitors. As indicated in step 710, a DCXO with a binary coded coarse array and a thermometer coded fine array of tuning capacitors is provided.

The amplifier, decoding logic for the fine arrays, and coarse and fine arrays of tuning capacitors reside on the same integrated circuit die. In one embodiment, the components are fabricated as complementary metal oxide semiconductor (CMOS) components on the integrated circuit die. The capacitor arrays may be structured as p-n junction, metal-metal, polysilicon, metal oxide semiconductor (MOS) capacitors, or any other capacitor architecture suitable for incorporation into an integrated circuit.

Step 720 determines if a change in coarse adjustment is required. The manner of making this determination may depend upon design choices in the extent of the tuning range of the thermometer coded array. In one embodiment, for example, a change in coarse adjustment is required if the required change in capacitance is more than one-half the range of the thermometer coded array.

During initial attempts to communicate between the ends of the communication channel, for example, a pilot tone may be used to establish a coarse synchronization. The receiver or client end makes coarse adjustments if necessary until it is synchronized to the pilot tone within a coarse tuning window defined by the capacitance associated with the least significant bit of the coarse tuning array. This initial coarse tuning accounts for process variations between the crystals at each end of the communication channel as well as initial temperature differences. Fine tuning is used to tune out subsequent temperature variations.

Subsequent "coarse" tuning adjustments on the same communication channel to adjacent "coarse" settings during the current session might not require the pilot tone because they are a result only of the range limitations of the fine tuning process.

If a change in coarse adjustment is required, the fine tuning array is set to mid-range in step 730. The coarse array is then varied in step 740 until the difference between the output frequency and the desired frequency corresponds to a change of capacitance no greater than half the range of the fine tuning array. In one embodiment, the coarse array is varied until the desired frequency requires a change of capacitance less than the capacitance associated with the least significant bit of the coarse tuning array (i.e., $C_B$).

Step 750 determines if a change in fine tuning is required. For a quadrature amplitude modulated communication channel, the phase shift of the incoming data signal can be used as the fine tuning error signal.

If a change in fine tuning is required, then the fine array of capacitors is adjusted in step 760 until the precise clock frequency is reached (i.e., the error signal is substantially zero or within tolerable limits).

After achieving the desired frequency with the fine tuning control (at least within acceptable error limits), the process returns to step 720. As indicated by branches of steps 720 and 750, although coarse or fine tuning is performed only when required, the process of determining whether any coarse or fine tuning is required is a continuous process. The coarse and fine tuning need only be performed as necessary to maintain the output frequency within an acceptable error range (e.g., 1 ppm) of the desired frequency.

Figure 8:
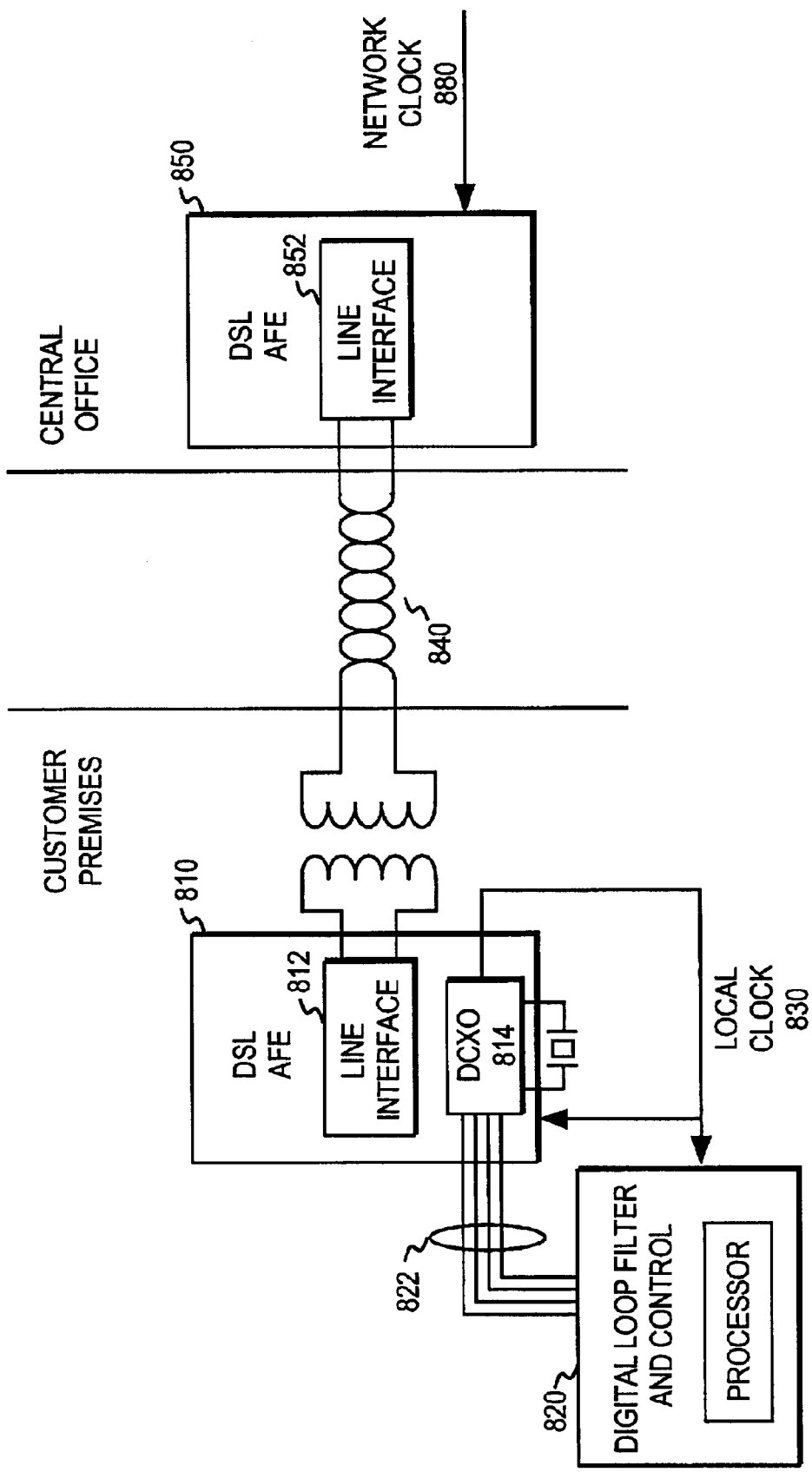
FIG. 8 illustrates the use of a DCXO in a digital subscriber line application.

FIG. 8 illustrates a DCXO in the context of a digital subscriber line (DSL) application. The public switched telephone network (PSTN) includes a plurality of central offices for servicing customers within specific regional areas. The central offices include a line interface 852 for communicating from the PSTN to the customer or subscriber premises on a subscriber line 840. A corresponding line interface 812 is present at the customer premises.

In this example, line interface 812 is part of a DSL analog front end (AFE) 810. The AFE conditions signals communicated between the central office and the customer premises. Digital data is encoded using a multicarrier protocol such as discrete multitone modulation and communicated in analog form between the customer premises and the central office. Synchronization between the local clock 830 and the network clock 880 is required for efficient communication.

Digital loop filter and control 820 controls the DCXO 814 from which local clock signal 830 is derived. Digital loop filter and control 820 varies local clock 830 by adjusting the frequency of DCXO through digital input codes provided on control lines 822. Digital loop filter and control 820 is responsible for ensuring that local clock signal 830 accurately tracks network clock 880. The DCXO and the digital loop filter and control co-operate to maintain precise tracking between the local and network clocks in order to avoid loss of data or inefficient transfer of data between the ends of the communication channel represented by the customer premises and the central office.

An integrated circuit DCXO apparatus and methods for tuning the DCXO are provided. The segmented switched capacitor network may be fabricated on the same integrated circuit as the amplifier, digital loop filter, or the controlling processor using CMOS fabrication techniques. Although the DCXO is based on a Pierce type oscillator, the segmented switched capacitor network and methods for tuning may be applied to other oscillator architectures including Colpitts, Clapp, Butler, Modified Butler, and Gate oscillator circuits.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A method of tuning a digitally controlled crystal oscillator (DCXO) to a desired frequency, comprising the steps of:

a) providing a DCXO having a coarse tuning array and a fine tuning array of capacitors fabricated on a same integrated circuit die, wherein the coarse tuning array comprises a binary weighted switched capacitor network, wherein the fine tuning array comprises a thermometer coded switched capacitor network;

b) adjusting the coarse tuning array until a difference between the desired frequency and the DCXO output frequency corresponds to a required change in capacitance no greater than half the range of the fine tuning array; and c) adjusting the fine tuning array until the output frequency substantially matches the desired frequency.

2. The method of claim 1 wherein step b) further comprises the step of adjusting the coarse tuning array until the required change in capacitance is less than a capacitance associated with a least significant bit of the coarse tuning array.

3. The method of claim 1 further comprising the step of:

e) setting the fine tuning array to mid-range before adjusting the coarse tuning array.

4. The method of claim 1 wherein the coarse and fine tuning arrays collectively form a segmented capacitor network providing a range of capacitance values that is a nonmonotonic function Z of a composite input code, wherein there exists distinct composite input code domains D1 and D2 with associated ranges R1 and R2 such that D1∩D2=∅ and R1∩R2≠∅.

5. The method of claim 4 wherein there exists distinct composite input codes $\theta_1$, $\theta_2$ such that $Z(\theta_1) \approx Z(\theta_2)$.

6. The method of claim 1 wherein the coarse and fine tuning arrays collectively form a segmented capacitor network providing a range of capacitance values that is a monotonic function Z of a composite input code, wherein a first n bits of the composite input code control the coarse tuning array, wherein a remaining m bits of the composite input code control the fine tuning array, wherein distinct composite input code domains D1 and D2 have distinct associated ranges R1 and R2 such that if $D1 \cap D2 = \emptyset$ then $R1 \cap R2 = \emptyset$.

7. The method of claim 1 wherein the coarse tuning array is an n-bit binary weighted switched capacitor network with a switchable capacitance $C_B$ associated with a least significant bit, wherein the fine tuning array is an m-bit thermometer coded switched capacitor network having $2^m$ switched capacitors of substantially the same capacitance, $C_T$.

8. The method of claim 7 wherein $2^m C_T < C_B$.

9. The method of claim 7 wherein $C_B \leq 2^m C_T$.

10. A digitally controlled crystal oscillator (DCXO) apparatus comprising:
   a) a coarse tuning array of capacitors comprising an n-bit binary weighted switched capacitor network with a switchable capacitance $C_B$ associated with a least significant bit, the coarse tuning array providing a first range of tuning capacitance; and
   b) a fine tuning array of capacitors comprising an m-bit thermometer coded switched capacitor network having $2^m$ switched capacitors of substantially the same capacitance $C_T$, the fine tuning array providing a second range of tuning capacitance, the fine tuning array coupled in parallel with the coarse tuning array to form a first segmented capacitor network, wherein the coarse and fine tuning arrays are formed on a same integrated circuit die, wherein $C_B > C_T$.

11. The apparatus of claim 10 further comprising a second segmented capacitor network, wherein the first and second segmented capacitor networks correspond to variable capacitive elements of the DCXO.

12. The apparatus of claim 11 further comprising:
   c) a processor controlling each of the first and second segmented capacitor networks to vary a frequency of the DCXO.

13. The apparatus of claim 11 wherein the oscillator is a selected one of a Pierce, Colpitts, and a Clapp type oscillator.

14. The apparatus of claim 10 further comprising:
   c) a processor controlling the first segmented capacitor network to vary a frequency of the DCXO.

15. The apparatus of claim 14 wherein the processor adjusts the coarse tuning array while maintaining the fine tuning array at mid-range until a difference in the DCXO output frequency and a desired frequency corresponds to a change in capacitance of the coarse tuning array not exceeding the capacitance associated with a least significant bit of the coarse tuning array.

16. The apparatus of claim 15 wherein the processor adjusts the fine tuning array until the output frequency of the DCXO substantially matches a desired frequency.

17. The apparatus of claim 10 wherein $2^m C_T < C_B$.

18. The apparatus of claim 10 wherein $C_B \leq 2^m C_T$.

19. The apparatus of claim 10 wherein the first segmented capacitor network provides a range of capacitance values that is a nonmonotonic function Z of an input code, wherein there exists distinct input code domains D1 and D2 with associated ranges R1 and R2 such that $D1 \cap D2 = \emptyset$ and $R1 \cap R2 \neq \emptyset$.

20. The apparatus of claim 19 wherein there exists distinct input codes $\theta_1$, $\theta_2$ such that $Z(\theta_1) \approx Z(\theta_2)$.

21. A digitally controlled crystal oscillator (DCXO) apparatus comprising:
   an n-bit binary weighted coarse tuning array of capacitors;
   an m-bit thermometer coded fine tuning array of capacitors coupled in parallel with the coarse tuning array to form a segmented switched capacitor network, wherein the segmented switched capacitor network provides a capacitance that is a nonmonotonic function Z of a composite input code; and
   a processor coupled to provide the composite input code, wherein an output frequency of the DCXO varies in response to the composite input code.

22. The apparatus of claim 21 wherein the thermometer coded array comprises unit capacitances $C_T$ of substantially the same value, wherein the least significant bit of the binary weighted array has an associated capacitance $C_B$, wherein $2^m C_T < C_B$.

23. The apparatus of claim 21 wherein the thermometer coded array comprises unit capacitances $C_T$ of substantially the same value, wherein the least significant bit of the binary weighted array has an associated capacitance $C_B$, wherein $2^m C_T \geq C_B$.

* * * * *